United States Patent
Weber et al.

(10) Patent No.: US 11,637,185 B2
(45) Date of Patent: Apr. 25, 2023

(54) CONTACT STACKS TO REDUCE HYDROGEN IN SEMICONDUCTOR DEVICES

(71) Applicant: Intel Corporation, Santa Clara, CA (US)

(72) Inventors: Justin Weber, Portland, OR (US); Harold Kennel, Portland, OR (US); Abhishek Sharma, Portland, OR (US); Christopher Jezewski, Portland, OR (US); Matthew V. Metz, Portland, OR (US); Tahir Ghani, Portland, OR (US); Jack T. Kavalieros, Portland, OR (US); Benjamin Chu-Kung, Portland, OR (US); Van H. Le, Portland, OR (US); Arnab Sen Gupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1003 days.

(21) Appl. No.: 16/141,301

(22) Filed: Sep. 25, 2018

(65) Prior Publication Data
US 2020/0098874 A1    Mar. 26, 2020

(51) Int. Cl.
| | |
|---|---|
| *H01L 29/36* | (2006.01) |
| *H01L 29/22* | (2006.01) |
| *H01L 29/24* | (2006.01) |
| *H01L 29/47* | (2006.01) |
| *H01L 21/322* | (2006.01) |

(Continued)

(52) U.S. Cl.
CPC ........ *H01L 29/36* (2013.01); *H01L 21/02554* (2013.01); *H01L 21/02565* (2013.01); *H01L 21/322* (2013.01); *H01L 21/768* (2013.01); *H01L 29/22* (2013.01); *H01L 29/2203* (2013.01); *H01L 29/24* (2013.01);

(Continued)

(58) Field of Classification Search
CPC ............... H01L 29/36; H01L 21/02554; H01L 21/02565; H01L 21/322; H01L 21/768; H01L 29/22; H01L 29/2203; H01L 29/24; H01L 29/267; H01L 29/45; H01L 29/47; H01L 29/7839; H01L 21/823475; H01L 21/823871; H01L 29/41725–41791; H01L 29/665–66507

See application file for complete search history.

(56) References Cited

U.S. PATENT DOCUMENTS

| | | | |
|---|---|---|---|
| 2017/0271517 A1* | 9/2017 | Kimura | H01L 29/78648 |
| 2019/0249299 A1* | 8/2019 | Park | C23C 16/40 |
| 2019/0355672 A1* | 11/2019 | Fujita | H01L 23/564 |

* cited by examiner

*Primary Examiner* — Shahed Ahmed
(74) *Attorney, Agent, or Firm* — Schwabe, Williamson & Wyatt, P.C.

(57) ABSTRACT

Embodiments herein describe techniques for an integrated circuit that includes a substrate, a semiconductor device on the substrate, and a contact stack above the substrate and coupled to the semiconductor device. The contact stack includes a contact metal layer, and a semiconducting oxide layer adjacent to the contact metal layer. The semiconducting oxide layer includes a semiconducting oxide material, while the contact metal layer includes a metal with a sufficient Schottky-barrier height to induce an interfacial electric field between the semiconducting oxide layer and the contact metal layer to reject interstitial hydrogen from entering the semiconductor device through the contact stack. Other embodiments may be described and/or claimed.

20 Claims, 8 Drawing Sheets

(51) Int. Cl.
*H01L 29/45* (2006.01)
*H01L 21/02* (2006.01)
*H01L 21/768* (2006.01)
*H01L 29/267* (2006.01)

(52) U.S. Cl.
CPC ............ *H01L 29/267* (2013.01); *H01L 29/45* (2013.01); *H01L 29/47* (2013.01)

US 11,637,185 B2

CONTACT STACKS TO REDUCE HYDROGEN IN SEMICONDUCTOR DEVICES

FIELD

Embodiments of the present disclosure generally relate to the field of integrated circuits.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Hydrogen in a semiconductor device may cause various undesirable alterations that can change the doping, stability, and other properties of the semiconductor device. For example, hydrogen in a channel layer of a transistor may cause large threshold voltage of the transistor as well as unintentional doping.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
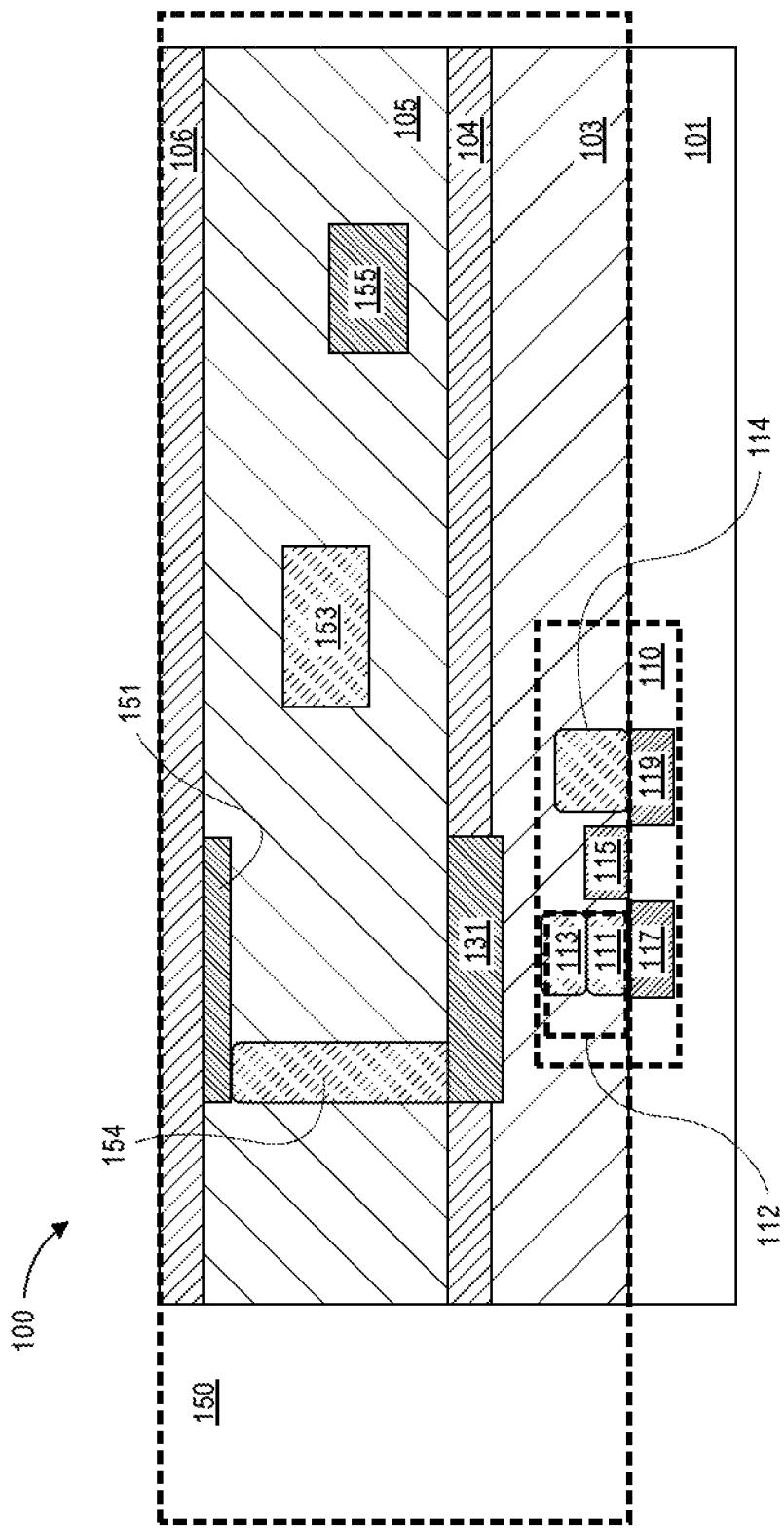
FIG. 1 schematically illustrates a diagram of an integrated circuit (IC) including a contact stack having a semiconducting oxide layer and a contact metal layer, in accordance with some embodiments.

An integrated circuit (IC) may contain various components or semiconductor devices to function together for many applications, e.g., a memory, a logic application, a radio frequency (RF) application. Fabrication of an IC may be divided into front-end-of-line (FEOL) semiconductor processing and back-end-of-line (BEOL) semiconductor processing. At FEOL, individual devices (e.g., transistors, capacitors, resistors, etc.) are patterned in a semiconductor substrate or layer. Following the FEOL operation, the result is typically a wafer with isolated transistors (e.g., without any wires). During BEOL, the individual devices are interconnected with wiring on the wafer, e.g., an interconnect structure with metallization layers. An interconnect structure may include multiple layers of conductors coupled to each other by vias through inter-level dielectric (ILD) layers separating the conductors. A conductor may also be referred to as a conductive contact, a contact, a metal line, or any other terms used in the industry. Vias may be used to connect one conductor in a metal layer to another conductor in another metal layer. For modern IC processes, more than 10 metal layers may be added in the BEOL.

Hydrogen in a semiconductor device may cause various undesirable alterations that can change the doping, stability, and other properties of the semiconductor device. Embodiments may include various contact stacks to reduce hydrogen in semiconductor devices. A contact stack's ability to block or reduce hydrogen from entering a semiconductor device may depend on the combination of materials, the order of the material layers, or other factors. A contact stack may include a semiconducting oxide layer and a semiconducting oxide layer adjacent to the contact metal layer. The semiconducting oxide layer includes a semiconducting oxide material, the contact metal layer includes a metal with a sufficient Schottky-barrier height (SBH) to induce an interfacial electric field between the semiconducting oxide layer and the contact metal layer to reject interstitial hydrogen from entering the semiconductor device. The contact stack may be used as a contact to an individual device (e.g., a transistor, a capacitor, a resistor, etc.), or as a via or plug in an interconnect structure.

Embodiments herein may present an IC that includes a substrate, a semiconductor device on the substrate, and a contact stack above the substrate and coupled to the semiconductor device. The contact stack includes a contact metal layer, and a semiconducting oxide layer adjacent to the contact metal layer. The semiconducting oxide layer includes a semiconducting oxide material, while the contact metal layer includes a metal with a sufficient SBH to induce an interfacial electric field between the semiconducting oxide layer and the contact metal layer to reject interstitial hydrogen from entering the semiconductor device.

In embodiments, a method for forming an IC includes forming a semiconducting oxide layer coupled to a semiconductor device, and forming a contact metal layer adjacent to the semiconducting oxide layer. The semiconducting oxide layer includes a semiconducting oxide material, and the contact metal layer includes a metal with a sufficient SBH to induce an interfacial electric field between the semiconducting oxide layer and the contact metal layer to reject interstitial hydrogen from entering the semiconductor device.

Embodiments herein may present a computing device, which may include a circuit board, and an IC coupled to the circuit board. The IC includes a contact stack above a substrate, and coupled to a semiconductor device. The contact stack includes a contact metal layer, and a semiconducting oxide layer adjacent to the contact metal layer. The semiconducting oxide layer includes a semiconducting oxide material, and the contact metal layer includes a metal with a sufficient SBH to induce an interfacial electric field between the semiconducting oxide layer and the contact metal layer to reject interstitial hydrogen from entering the semiconductor device.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of an IC 100 including a contact stack, e.g., a contact stack 112, a contact stack 114, a contact stack 153, or a contact stack 154, having a semiconducting oxide layer, e.g., a semiconducting oxide layer 111, and a contact metal layer, e.g., a contact metal layer 113, in accordance with some embodiments. For clarity, features of the integrated circuit 100, the contact stack 112, the contact stack 114, the contact stack 153, the contact stack 154, the semiconducting oxide layer 111, the contact metal layer 113, may be described below as examples for understanding an example IC including a contact stack having a semiconducting oxide layer and a contact metal layer. It is to be understood that there may be more or fewer components within an example IC including a contact stack having a semiconducting oxide layer and a contact metal layer. Further, it is to be understood that one or more of the components within an example IC including a contact stack having a semiconducting oxide layer and a contact metal layer may include additional and/or varying features from the description below, and may include any device that one having ordinary skill in the art would consider and/or refer to as an example IC including a contact stack having a semiconducting oxide layer and a contact metal layer.

In embodiments, the semiconductor device 100 may include a substrate 101. Various semiconductor devices, e.g., a transistor 110, may be formed on the substrate 101. Furthermore, an interconnect structure 150 is formed above the substrate 101 and the transistor 110. In detail, the transistor 110 has a source area 117 and a drain area 119 within the substrate 101, a gate electrode 115, the contact stack 112, and the contact stack 114 above the substrate 101. The interconnect structure 150 may include an ILD layer 103 above the substrate 101, and an ILD layer 105 above the ILD layer 103. A separation layer 104 may be above the ILD layer 103, and a separation layer 106 may be above the ILD layer 105. A conductor 131 may be within the ILD layer 103 and the separation layer 104. The ILD layer 105 may include more contacts or conductors, e.g., a conductor 151, the contact stack 153, and a conductor 155. A via, e.g., the contact stack 154, may be through the ILD layer 105 to couple the conductor 151 and the conductor 131. There may be other components, such as passive components within the ILD layer 103 or the ILD layer 105, not shown.

In embodiments, the contact stack 112, the contact stack 114, the contact stack 153, the contact stack 154, may function as a source electrode, a drain electrode to an individual device (e.g., the transistor 110), a via or plug in the interconnect structure 150, or a conductor within an ILD. A contact stack, e.g., the contact stack 112, may include the semiconducting oxide layer 111, and the contact metal layer 113. Other contact stacks, e.g., the contact stack 114, the contact stack 153, the contact stack 154, may include similar layers of materials, as shown in more details in FIG. 2-FIG. 5. The semiconducting oxide layer 111 may include a semiconducting oxide material, and the contact metal layer 113 may include a metal with a sufficient SBH to induce an interfacial electric field between the semiconducting oxide layer and the contact metal layer to reject interstitial hydrogen from entering the semiconductor device.

For example, the conductor 131, the conductor 151, and the conductor 155 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. For example, the conductor 131, the conductor 151, and the conductor 155 may include tantalum nitride (TaN), titanium nitride (TiN), iridium-tantalum alloy (Ir—Ta), indium-tin oxide (ITO), the like, and/or a combination thereof.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 or the ILD layer 105 may include silicon dioxide ($SiO_2$), carbon doped oxide (CDO), silicon nitride, perfluorocyclobutane, polytetrafluoroethylene, fluorinated silicate glass (FSG), organic polymer, siloxane, a porous dielectric material, or organosilicate glass. In some embodiments, the ILD layer 103 or the ILD layer 105 may include some low-k dielectric materials. Suitable dielectric materials may include carbon-doped silicon dioxide materials, organic polymeric thermoset materials, silicon oxycarbide; SiCOH dielectrics; fluorine doped silicon oxide; spin-on glasses, silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric material.

In embodiments, the separation layer 104 or the separation layer 106 may include one or more of an etching stop layer, a barrier layer, a capping layer, or a hard mask layer. For example, the separation layer 104 may be a hardmask layer including silicon nitride, silicon carbide, or silicon oxide. In some embodiments, the separation layer 104 may include a barrier layer comprising, for example, a titanium (Ti) layer, titanium-nitride (TiN) layer, tantalum (Ta) layer, tantalum-nitride (TaN) layer or other material layer that is capable of reducing or preventing metallic ions of the conductors, e.g., the conductor 131, the conductor 151, the conductor 153, and the conductor 155, from diffusing into the surrounding regions of the substrate.

Figure 2:
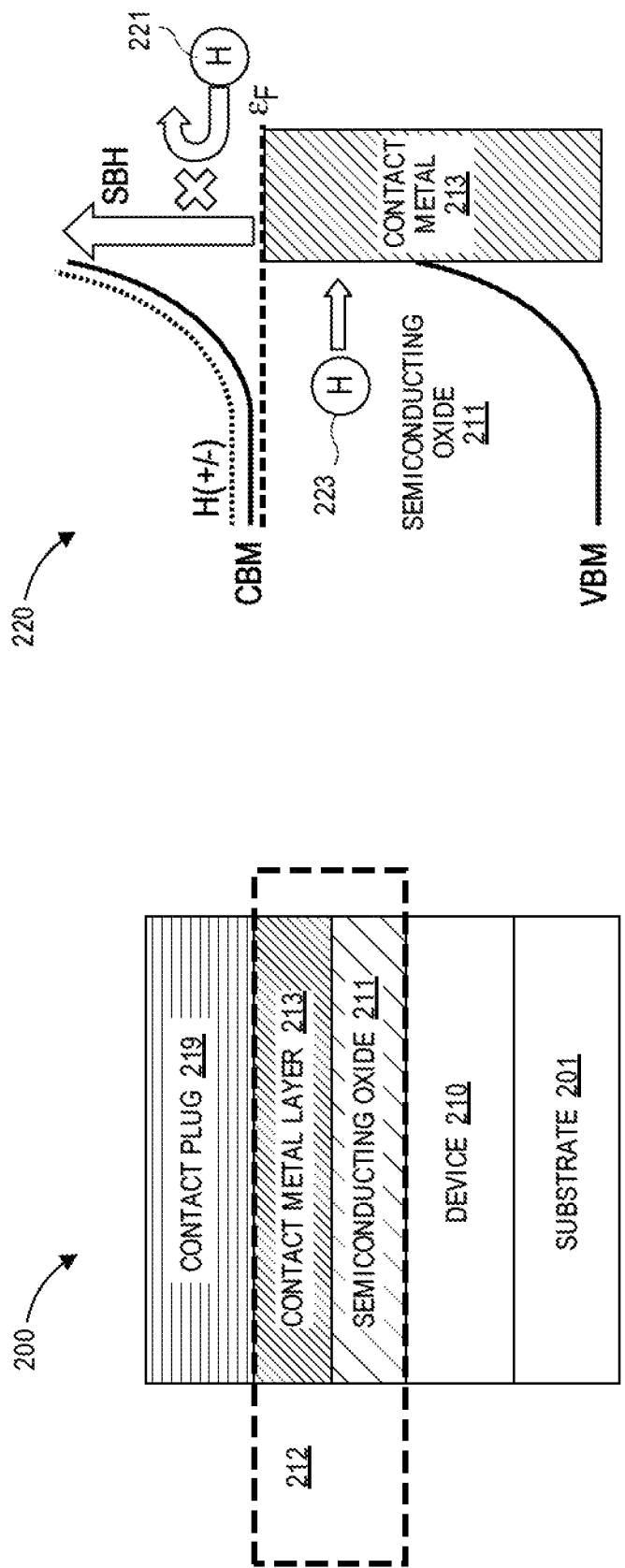
FIG. 2 schematically illustrates another diagram of an IC including a contact stack having a semiconducting oxide layer and a contact metal layer, in accordance with some embodiments.

FIG. 2 schematically illustrates another diagram of an IC 200 including a contact stack 212 having a semiconducting oxide layer 211 and a contact metal layer 213, in accordance with some embodiments. The IC 200, the contact stack 212, the semiconducting oxide layer 211, and the contact metal layer 213 may be an example of the IC 100, the contact stack 112, the semiconducting oxide layer 111, and the contact metal layer 113, as shown in FIG. 1.

In embodiments, the IC 200 includes a substrate 201 and a semiconductor device 210. The contact stack 212 is above the substrate 201 and coupled to the semiconductor device 210. The semiconductor device 210 may be a transistor, e.g., similar to the transistor 110, while the contact stack 212 may be a source electrode of the transistor, or a drain electrode of the transistor. Additionally and alternatively, the contact stack 212 may be a via of the IC 200. The IC 200 may further include a contact plug 219 adjacent to the contact stack 212.

In embodiments, the contact stack 212 includes the semiconducting oxide layer 211 coupled to the semiconductor device 210, and the contact metal layer 213 adjacent to the semiconducting oxide layer 211. The semiconducting oxide layer 211 includes a semiconducting oxide material, and the contact metal layer 213 includes a metal with a sufficient SBH to induce an interfacial electric field between the semiconducting oxide layer 211 and the contact metal layer 213 to reject interstitial hydrogen from entering the semiconductor device. In embodiments, the semiconducting oxide material of the semiconducting oxide layer 211 may be an n-type material or a p-type material.

For example, the semiconducting oxide material of the semiconducting oxide layer 211 may be an n-type material including ZnO, CdO, $In_2O_3$, $Ga_2O_3$, $SnO_2$, IGZO, IZO, ITO, GZO, or $TiO_2$, and the metal in the contact metal layer 213 may include Sn, W, Ir, Pt, Ru, Rh, or Ni. An example band diagram 220 illustrates how the semiconducting oxide layer 211 and the contact metal layer 213 to function as a hydrogen-rejecting contact stack. The band diagram 220 includes the conduction-band minimum (CBM), and the valence band maximum (VBM) of the semiconductor oxide material of the semiconducting oxide layer 211, and their dependence of the intrinsic Fermi level (Ef). An interstitial hydrogen, e.g., an interstitial hydrogen 223, may behave exclusively as a donor in the semiconducting oxide layer 211. When the metal in the contact metal layer 213 has a sufficient n-Schottky-barrier height (nSBH), an interfacial electric field is formed between the semiconducting oxide layer 211 and the contact metal layer 213. An interstitial hydrogen 221 that is positively charged atomic hydrogen may be rejected, as illustrated by the presence of the H(+/−) level being above the CBM of the semiconducting oxide material of the semiconducting oxide layer 211. Furthermore, in some embodiments, there may be a tradeoff between contact resistance and electrostatic rejection of hydrogen for the contact stack 212. For example, a choice of a metal in the contact metal layer 213 with a larger work function may have a better result in rejecting interstitial hydrogen, but may also induce a larger contact resistance for the contact stack 212.

Additionally and alternatively, the semiconducting oxide material of the semiconducting oxide layer 211 may be a p-type material including SnO, $Cu_2O$, CuO, $VO_2$, NiO, $ZnRh_2O_4$, $AlCuO_2$, $SrCu_2O_2$, or $La_2SeO_2$, and the metal in the contact metal layer 213 may include Mn, Zn, or Cr. For p-type semiconducting oxide material of the semiconducting oxide layer 211, the interstitial hydrogen may behave exclusively as an acceptor in the semiconducting oxide layer, and the rejected interstitial hydrogen may be negatively charged atomic hydrogen.

Figure 3:
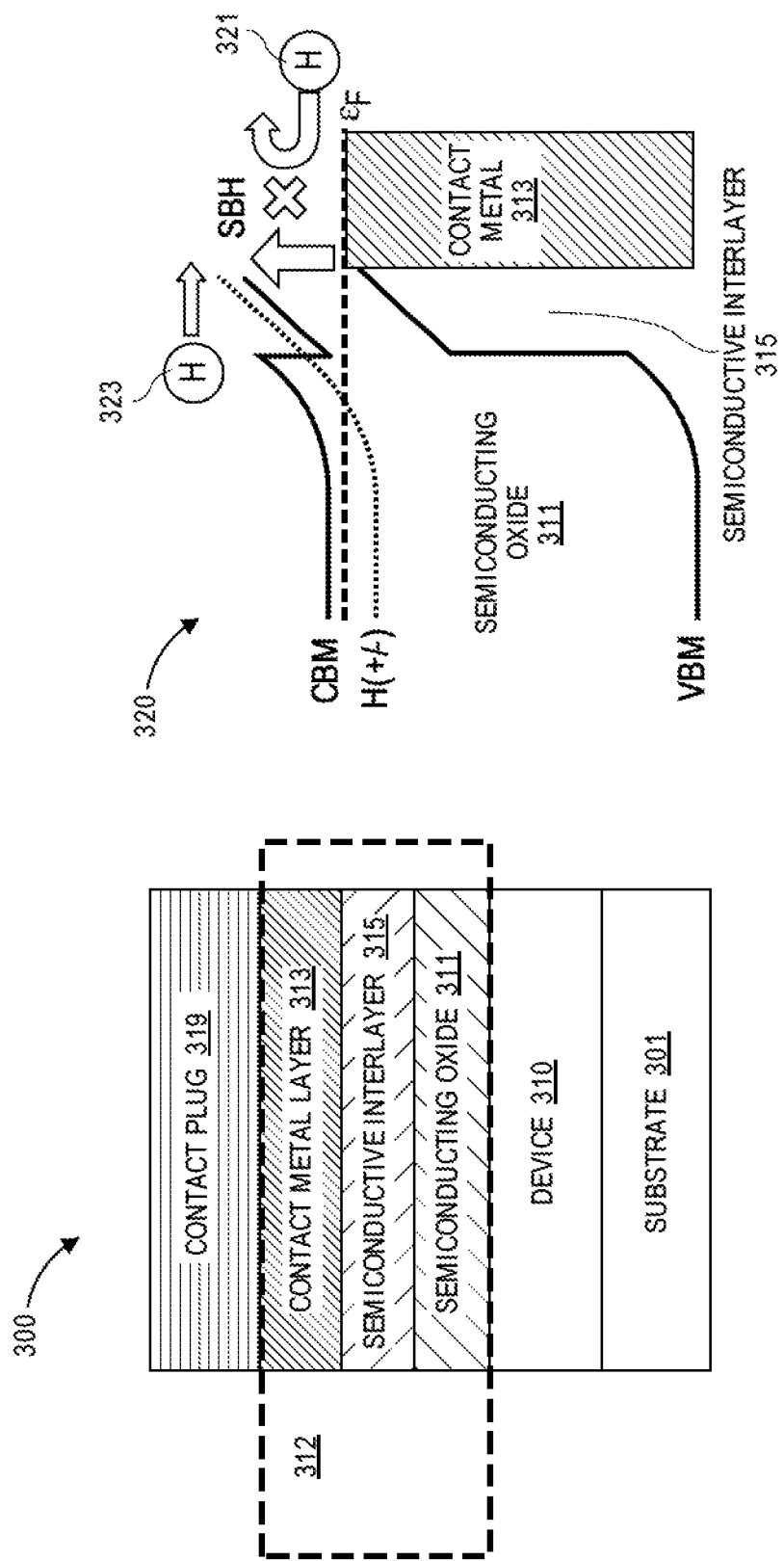
FIG. 3 schematically illustrates another diagram of an IC including a contact stack having a semiconducting oxide layer and a contact metal layer, in accordance with some embodiments.

FIG. 3 schematically illustrates another diagram of an IC 300 including a contact stack 312 having a semiconducting oxide layer 311 and a contact metal layer 313, in accordance with some embodiments. The IC 300, the contact stack 312, the semiconducting oxide layer 311, and the contact metal layer 313 may be an example of the IC 100, the contact stack 112, the semiconducting oxide layer 111, and the contact metal layer 113, as shown in FIG. 1.

In embodiments, the IC 300 includes a substrate 301 and a semiconductor device 310. The contact stack 312 is above the substrate 301 and coupled to the semiconductor device 310. The semiconductor device 310 may be a transistor, e.g., similar to the transistor 110, while the contact stack 312 may be a source electrode of the transistor, or a drain electrode of the transistor. Additionally and alternatively, the contact stack 312 may be a via of the IC 300. The IC 300 may further include a contact plug 319 adjacent to the contact stack 312.

In embodiments, the contact stack 312 includes the semiconducting oxide layer 311 coupled to the semiconductor device 310, the contact metal layer 313 above the semiconducting oxide layer 311, and a semiconducting interlayer 315 between the contact metal layer 313 and the semiconducting oxide layer 311. The semiconducting oxide material of the semiconducting oxide layer 311 may be an n-type material or a p-type material. The semiconducting interlayer 315 may include InAs, InSb, InP, InN, CdSe, $SnO_2$, or $TiO_2$ when the semiconducting oxide material of the semiconducting oxide layer 311 is an n-type material. Additionally and alternatively, the semiconducting interlayer 315 may include Ge, Si, GaSb, AlSb, InSb, or CdTe when the semiconducting oxide material of the semiconducting oxide layer 311 is a p-type material.

In embodiments, the band diagram 320 includes the CBM, and VBM of the semiconductor oxide material of the semiconducting oxide layer 311, and their dependence of the intrinsic Fermi level (Ef). Positively or negatively charged atomic hydrogen, H(+/−), may have an energy level within the band gap between the CBM and VBM of the semiconductor oxide material of the semiconducting oxide. If the Fermi level is below the H(+/−) level, atomic hydrogen will act as a donor. On the other hand, if the Fermi level is above the H(+/−) level, atomic hydrogen will as an acceptor. Therefore, an interstitial hydrogen, e.g., an interstitial hydrogen 323, may behave as both a donor and an acceptor to the semiconducting oxide layer 311, depending on the position of the Fermi level of the semiconducting oxide material of the semiconducting oxide layer 311. In this case, a direct contact with a metal of the contact metal layer 313 may not be enough to reject interstitial hydrogen at the contact.

In embodiments, the metal in the contact metal layer 313 may be selected to have a sufficient SBH to induce an interfacial electric field between the semiconducting interlayer 315 and the contact metal layer 313 to reject interstitial hydrogen, e.g., an interstitial hydrogen 321, from entering the semiconductor device. An interstitial hydrogen behaves exclusively as a donor to the semiconducting interlayer 315. Similarly, in some embodiments, there may be a tradeoff between contact resistance and electrostatic rejection of hydrogen for the contact stack 312. For example, a choice of a metal in the contact metal layer 313 with a larger work function may have a better result in rejecting interstitial hydrogen, but may also induce a larger contact resistance for the contact stack 312.

Figure 4:
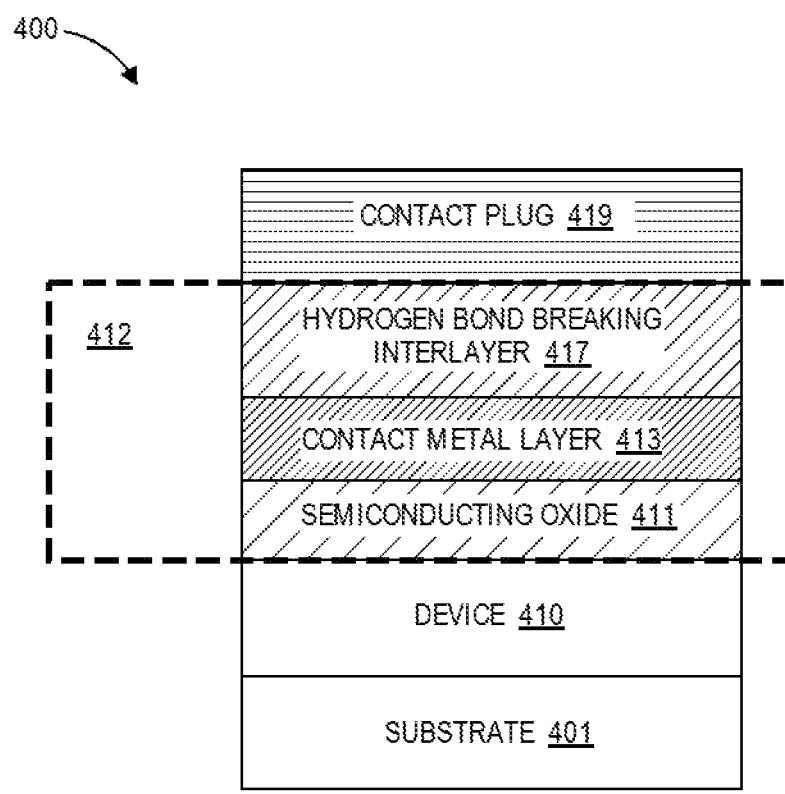
FIG. 4 schematically illustrates another diagram of an IC including a contact stack having a semiconducting oxide layer and a contact metal layer, in accordance with some embodiments.

FIG. 4 schematically illustrates another diagram of an IC 400 including a contact stack 412 having a semiconducting oxide layer 411 and a contact metal layer 413, in accordance with some embodiments. The IC 400, the contact stack 412, the semiconducting oxide layer 411, and the contact metal layer 413 may be an example of the IC 100, the contact stack 112, the semiconducting oxide layer 111, and the contact metal layer 113, as shown in FIG. 1.

In embodiments, the IC 400 includes a substrate 401 and a semiconductor device 410. The contact stack 412 is above the substrate 401 and coupled to the semiconductor device 410. The semiconductor device 410 may be a transistor, e.g., similar to the transistor 110, while the contact stack 412 may be a source electrode of the transistor, or a drain electrode of the transistor. Additionally and alternatively, the contact stack 412 may be a via of the IC 400. The IC 400 may further include a contact plug 419 adjacent to the contact stack 412.

In embodiments, the contact stack 412 includes the semiconducting oxide layer 411 coupled to the semiconductor device 410, the contact metal layer 413 above the semiconducting oxide layer 411, and a hydrogen bond breaking interlayer 417 above the contact metal layer 413 to break hydrogen bond to exploit electrostatics to reduce interstitial hydrogen entering the semiconductor device 410. The semiconducting oxide material of the semiconducting oxide layer 411 may be an n-type material or a p-type material. The hydrogen bond breaking interlayer 417 may include Pt, Ni, or Rh.

Figure 5:
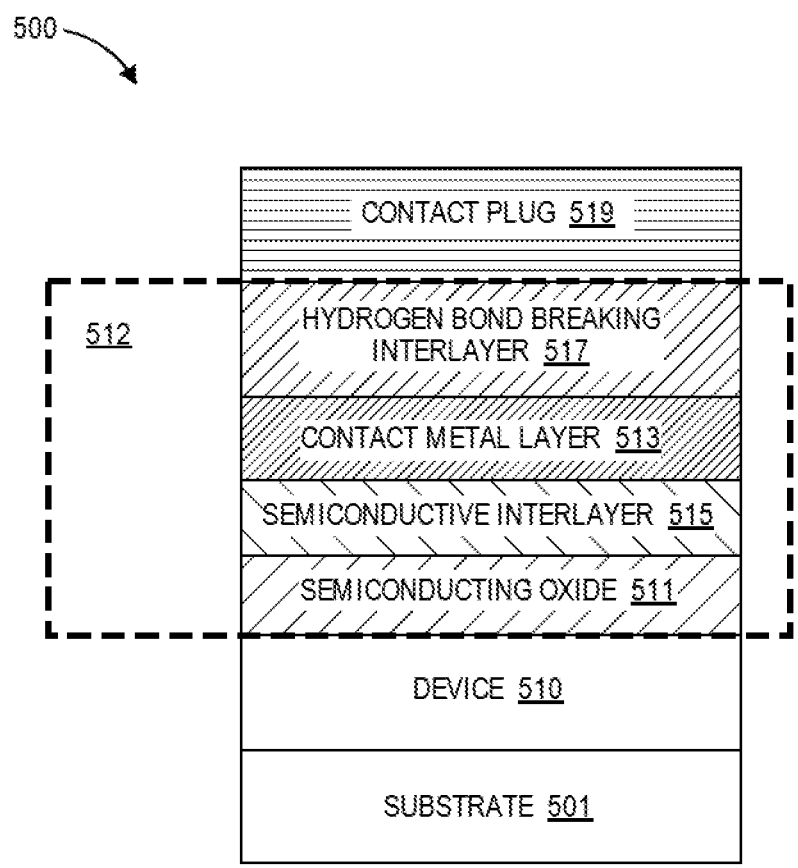
FIG. 5 schematically illustrates another diagram of an IC including a contact stack having a semiconducting oxide layer and a contact metal layer, in accordance with some embodiments.

FIG. 5 schematically illustrates another diagram of an IC 500 including a contact stack 512 having a semiconducting oxide layer 511 and a contact metal layer 513, in accordance with some embodiments. The IC 500, the contact stack 512, the semiconducting oxide layer 511, and the contact metal layer 513 may be an example of the IC 100, the contact stack 112, the semiconducting oxide layer 111, and the contact metal layer 113, as shown in FIG. 1.

In embodiments, the IC 500 includes a substrate 501 and a semiconductor device 510. The contact stack 512 is above the substrate 501 and coupled to the semiconductor device 510. The semiconductor device 510 may be a transistor, e.g., similar to the transistor 110, while the contact stack 512 may be a source electrode of the transistor, or a drain electrode of the transistor. Additionally and alternatively, the contact stack 512 may be a via of the IC 500. The IC 500 may further include a contact plug 519 adjacent to the contact stack 512.

In embodiments, the contact stack 512 includes the semiconducting oxide layer 511 coupled to the semiconductor device 510, the contact metal layer 513 above the semiconducting oxide layer 511, a semiconducting interlayer 515 between the contact metal layer 513 and the semiconducting oxide layer 511, and a hydrogen bond breaking interlayer 517 above the contact metal layer 513 to break hydrogen bond to exploit electrostatics to reduce interstitial hydrogen entering the semiconductor device 510. The semiconducting oxide material of the semiconducting oxide layer 511 may be an n-type material or a p-type material.

Figure 6:
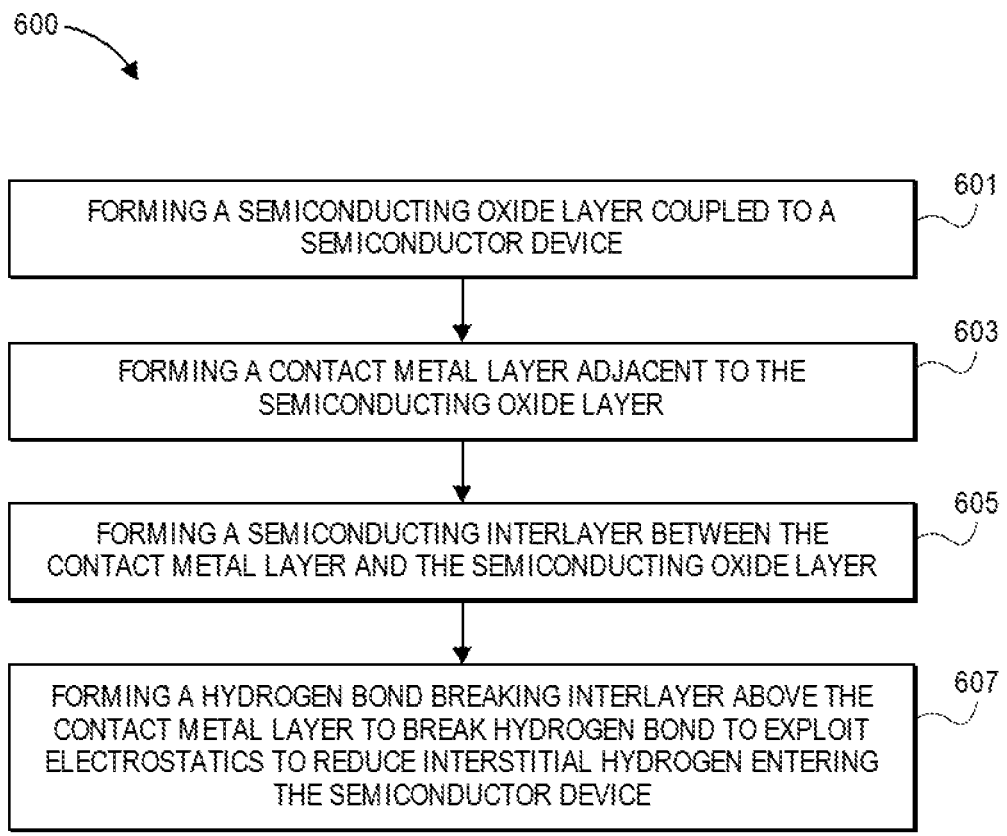
FIG. 6 illustrates a diagram of a process for forming an IC including a contact stack having a semiconducting oxide layer and a contact metal layer, in accordance with some embodiments FIG. 7 schematically illustrates an interposer implementing one or more embodiments of the disclosure, in accordance with some embodiments.

FIG. 6 illustrates a diagram of a process 600 for forming an IC including a contact stack having a semiconducting oxide layer and a contact metal layer, in accordance with some embodiments. In embodiments, the process 600 may be applied to form the IC 100 including the contact stack 112 in FIG. 1; the IC 200 including the contact stack 212 in FIG. 2; the IC 300 including the contact stack 312 in FIG. 3; the IC 400 including the contact stack 412 in FIG. 4; or the IC 500 including the contact stack 512 in FIG. 5.

At block 601, the process 600 may include forming a semiconducting oxide layer coupled to a semiconductor device. For example, the process 600 may include forming the semiconducting oxide layer 511 coupled to a semiconductor device 510 as shown in FIG. 5.

At block 603, the process 600 may include forming a contact metal layer above the semiconducting oxide layer. For example, the process 600 may include forming the contact metal layer 513 above the semiconducting oxide layer 511, as shown in FIG. 5.

At block 605, the process 600 may include forming a semiconducting interlayer between the contact metal layer and the semiconducting oxide layer. For example, the process 600 may include forming the semiconducting interlayer 515 between the contact metal layer 513 and the semiconducting oxide layer 511, as shown in FIG. 5.

At block 607, the process 600 may include forming a hydrogen bond breaking interlayer above the contact metal layer to break hydrogen bond to exploit electrostatics to reduce interstitial hydrogen entering the semiconductor device. For example, the process 600 may include forming a hydrogen bond breaking interlayer 517 above the contact metal layer 513 to break hydrogen bond to exploit electrostatics to reduce interstitial hydrogen entering the semiconductor device 510, as shown in FIG. 5.

In addition, the process 600 may include additional operations. For example, the process 600 may include forming the semiconductor device 510, forming ILD layers, or other contacts through or within the ILD layers.

Figure 7:
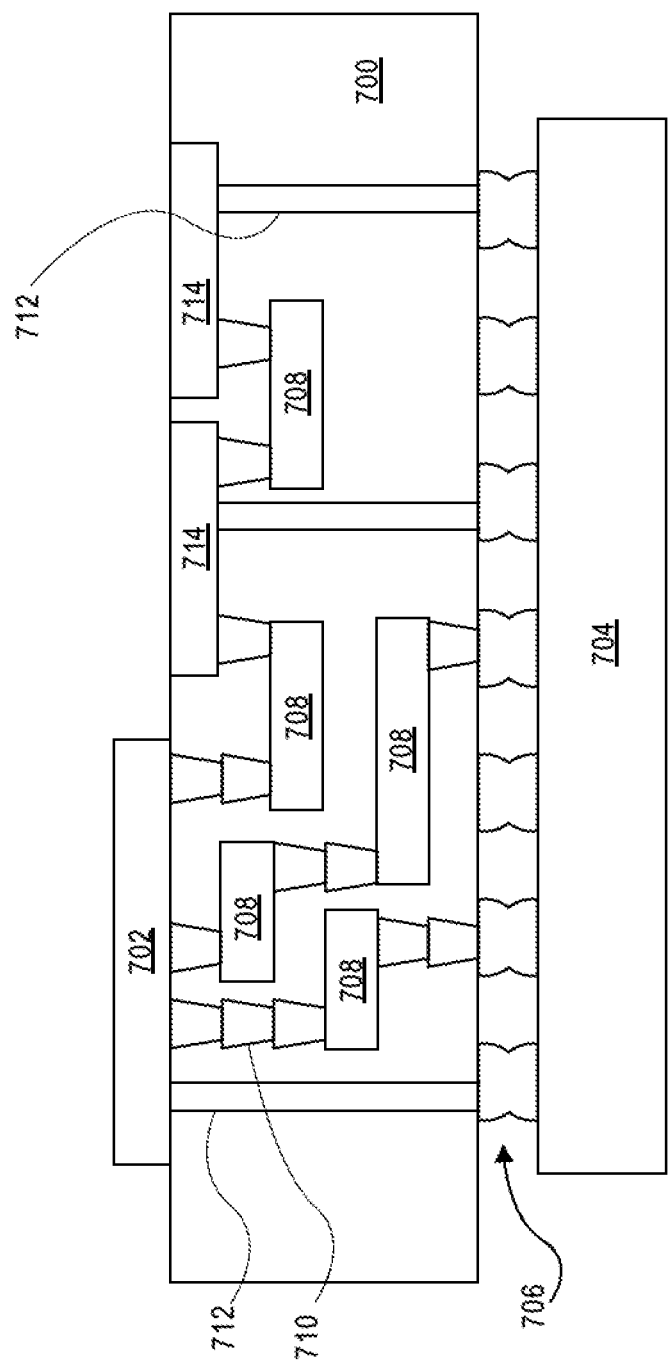

FIG. 7 illustrates an interposer 700 that includes one or more embodiments of the disclosure. The interposer 700 is an intervening substrate used to bridge a first substrate 702 to a second substrate 704. The first substrate 702 may be, for instance, a substrate support for the IC 100 including the contact stack 112 in FIG. 1; the IC 200 including the contact stack 212 in FIG. 2; the IC 300 including the contact stack 312 in FIG. 3; the IC 400 including the contact stack 412 in FIG. 4; or the IC 500 including the contact stack 512 in FIG. 5. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the disclosure, apparatuses or processes disclosed herein may be used in the fabrication of interposer 700.

Figure 8:
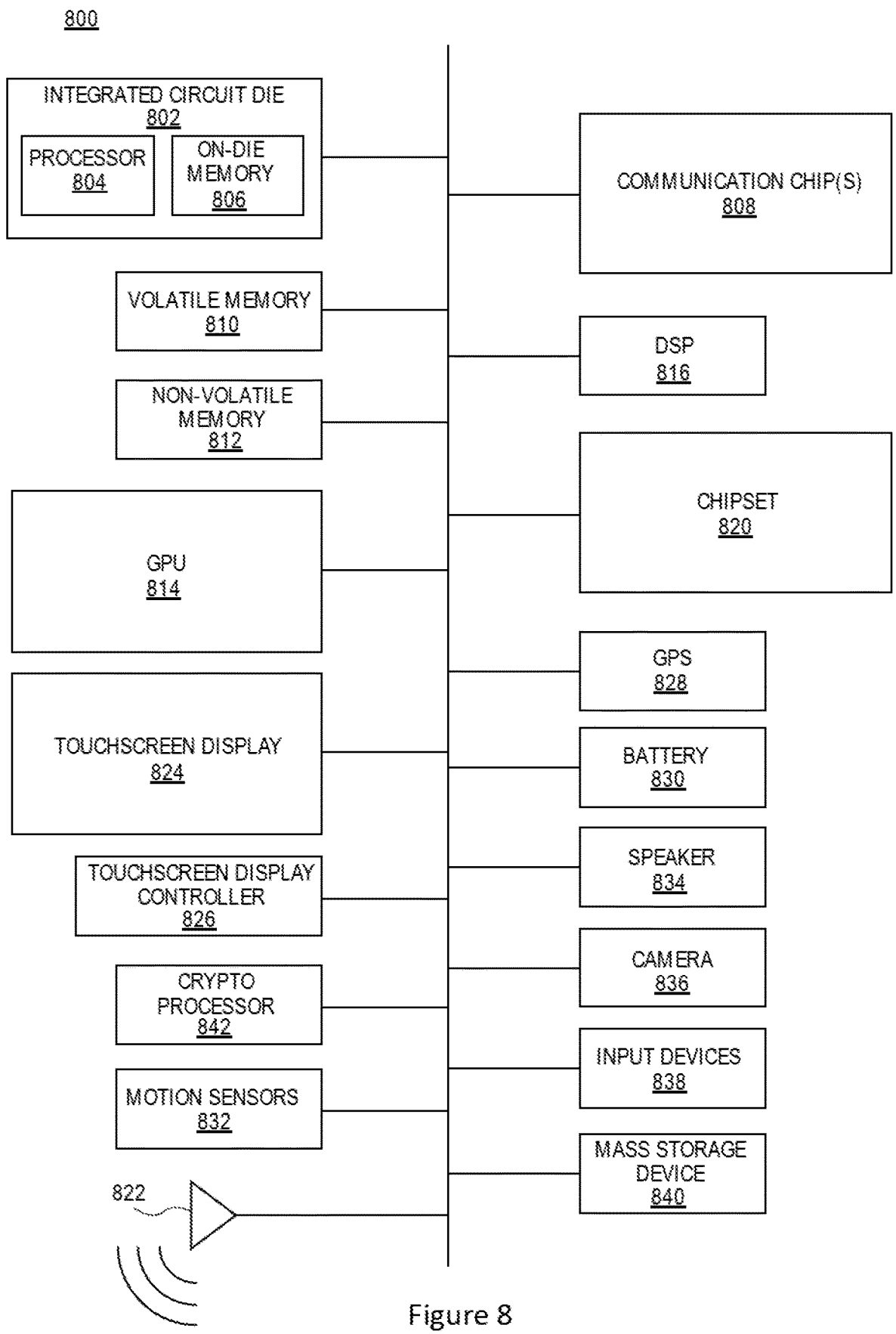
FIG. 8 schematically illustrates a computing device built in accordance with an embodiment of the disclosure, in accordance with some embodiments.

FIG. 8 illustrates a computing device 800 in accordance with one embodiment of the disclosure. The computing device 800 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 800 include, but are not limited to, an integrated circuit die 802 and at least one communication chip(s) 808. In some implementations, the communication chip(s) 808 is fabricated within the integrated circuit die 802 while in other implementations the communication chip(s) 808 is fabricated in a separate integrated circuit chip that may be bonded to a substrate or motherboard that is shared with or electronically coupled to the integrated circuit die 802. The integrated circuit die 802 may include a processor 804 as well as on-die memory 806, often used as cache memory, which can be provided by technologies such as embedded DRAM (eDRAM), or SRAM. For example, the on-die memory 806, the communication chip(s) 808, or the integrated circuit die 802, may include, e.g., the IC 100 including the contact stack 112 in FIG. 1; the IC 200 including the contact stack 212 in FIG. 2; the IC 300 including the contact stack 312 in FIG. 3; the IC 400 including the contact stack 412 in FIG. 4; or the IC 500 including the contact stack 512 in FIG. 5.

In embodiments, the computing device 800 may include a display or a touchscreen display 824, and a touchscreen display controller 826. A display or the touchscreen display 824 may include a FPD, an AMOLED display, a TFT LCD, a micro light-emitting diode (µLED) display, or others. For example, the touchscreen display 824 may include e.g., the IC 100 including the contact stack 112 in FIG. 1; the IC 200 including the contact stack 212 in FIG. 2; the IC 300 including the contact stack 312 in FIG. 3; the IC 400 including the contact stack 412 in FIG. 4; or the IC 500 including the contact stack 512 in FIG. 5.

Computing device 800 may include other components that may or may not be physically and electrically coupled to the motherboard or fabricated within a SoC die. These other components include, but are not limited to, volatile memory 810 (e.g., dynamic random access memory (DRAM), non-volatile memory 812 (e.g., ROM or flash memory), a graphics processing unit 814 (GPU), a digital signal processor (DSP) 816, a crypto processor 842 (e.g., a specialized processor that executes cryptographic algorithms within hardware), a chipset 820, at least one antenna 822 (in some implementations two or more antenna may be used), a battery 830 or other power source, a power amplifier (not shown), a voltage regulator (not shown), a global positioning system (GPS) device 828, a compass, a motion coprocessor or sensors 832 (that may include an accelerometer, a gyroscope, and a compass), a microphone (not shown), a speaker 834, a camera 836, user input devices 838 (such as a keyboard, mouse, stylus, and touchpad), and a mass storage device 840 (such as hard disk drive, compact disk (CD), digital versatile disk (DVD), and so forth). The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communication chip(s) 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip(s) 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communication chip(s) 808. For instance, a first communication chip(s) 808 may be dedicated to shorter range wireless communications such as Wi-Fi, NFC, and Bluetooth and a second communication chip(s) 808 may be dedicated to longer range wireless communications such as GPS, EDGE, GPRS, CDMA, WiMAX, LTE, Ev-DO, and others.

The processor 804 of the computing device 800 includes one or more devices, such as transistors. The term "processor" may refer to any device or portion of a device that processes electronic data from registers and/or memory to transform that electronic data into other electronic data that may be stored in registers and/or memory. The communication chip(s) 808 may also include one or more devices, such as transistors.

In further embodiments, another component housed within the computing device 800 may contain one or more devices, such as DRAM, that are formed in accordance with implementations of the current disclosure, the IC 100 including the contact stack 112 in FIG. 1; the IC 200 including the contact stack 212 in FIG. 2; the IC 300 including the contact stack 312 in FIG. 3; the IC 400 including the contact stack 412 in FIG. 4; or the IC 500 including the contact stack 512 in FIG. 5.

In various embodiments, the computing device 800 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some Non-Limiting Examples are Provided Below.

Example 1 may include an integrated circuit, comprising: a substrate; a semiconductor device on the substrate; a contact stack above the substrate and coupled to the semiconductor device, wherein the contact stack includes: a contact metal layer; and a semiconducting oxide layer above the contact metal layer, wherein the semiconducting oxide layer includes a semiconducting oxide material, the contact metal layer includes a metal with a sufficient Schottky-barrier height (SBH) to induce an interfacial electric field between the semiconducting oxide layer and the contact metal layer to reject interstitial hydrogen from entering the semiconductor device through the contact stack.

Example 2 may include the integrated circuit of example 1 and/or some other examples herein, wherein the interstitial hydrogen behaves exclusively as a donor in the semiconducting oxide layer, and the rejected interstitial hydrogen is positively charged atomic hydrogen.

Example 3 may include the integrated circuit of example 1 and/or some other examples herein, wherein the interstitial hydrogen behaves exclusively as an acceptor in the semiconducting oxide layer, and the rejected interstitial hydrogen is negatively charged atomic hydrogen.

Example 4 may include the integrated circuit of example 1 and/or some other examples herein, wherein the semiconducting oxide material is an n-type material or a p-type material.

Example 5 may include the integrated circuit of example 1 and/or some other examples herein, wherein the semiconducting oxide material is an n-type material including ZnO, CdO, $In_2O_3$, $Ga_2O_3$, $SnO_2$, IGZO, IZO, ITO, GZO, or $TiO_2$, and the metal in the contact metal layer includes Sn, W, Ir, Pt, Ru, Rh, or Ni.

Example 6 may include the integrated circuit of example 1 and/or some other examples herein, wherein the semiconducting oxide material is a p-type material including SnO, $Cu_2O$, CuO, $VO_2$, NiO, $ZnRh_2O_4$, $AlCuO_2$, $SrCu_2O_2$, or $La_2SeO_2$, and the metal in the contact metal layer includes Mn, Zn, or Cr.

Example 7 may include the integrated circuit of example 1 and/or some other examples herein, wherein the contact stack further includes: a semiconducting interlayer between the contact metal layer and the semiconducting oxide layer, wherein the interstitial hydrogen behaves as both a donor and an acceptor to the semiconducting oxide layer, and behaves exclusively as a donor to the semiconducting interlayer, the metal in the contact metal layer has a sufficient SBH to induce an interfacial electric field between the semiconducting interlayer and the contact metal layer to reject interstitial hydrogen from entering the semiconductor device through the contact stack.

Example 8 may include the integrated circuit of example 7 and/or some other examples herein, wherein the semiconducting interlayer includes InAs, InSb, InP, InN, CdSe, $SnO_2$, or $TiO_2$ when the semiconducting oxide material is an n-type material, or the semiconducting interlayer includes Ge, Si, GaSb, AlSb, InSb, or CdTe when the semiconducting oxide material is a p-type material.

Example 9 may include the integrated circuit of example 1 and/or some other examples herein, wherein the contact stack further includes: a hydrogen bond breaking interlayer above the contact metal layer to break hydrogen bond to exploit electrostatics to reduce interstitial hydrogen entering the semiconductor device through the contact stack.

Example 10 may include the integrated circuit of example 9 and/or some other examples herein, wherein the hydrogen bond breaking interlayer includes Pt, Ni, or Rh.

Example 11 may include the integrated circuit of example 1 and/or some other examples herein, wherein the semiconductor device is a transistor, and the contact stack is a source electrode of the transistor, or a drain electrode of the transistor.

Example 12 may include the integrated circuit of example 1 and/or some other examples herein, wherein the contact stack is a contact plug or a via of the integrated circuit.

Example 13 may include the integrated circuit of example 1 and/or some other examples herein, further comprising: a contact plug adjacent to the contact stack.

Example 14 may include a method for forming an integrated circuit, the method comprising: forming a semiconducting oxide layer coupled to a semiconductor device; and forming a contact metal layer above the semiconducting oxide layer, wherein the semiconducting oxide layer includes a semiconducting oxide material, the contact metal layer includes a metal with a sufficient Schottky-barrier height (SBH) to induce an interfacial electric field between the semiconducting oxide layer and the contact metal layer to reject interstitial hydrogen from entering the semiconductor device through the contact metal layer.

Example 15 may include the method of example 14 and/or some other examples herein, further comprises: forming a semiconducting interlayer between the contact metal layer and the semiconducting oxide layer, wherein the interstitial hydrogen behaves as both a donor and an acceptor to the semiconducting oxide layer, and behaves exclusively as a donor to the semiconducting interlayer, the metal in the contact metal layer has a sufficient SBH to induce an interfacial electric field between the semiconducting interlayer and the contact metal layer to reject interstitial hydrogen from entering the semiconductor device through the contact metal layer.

Example 16 may include the method of example 14 and/or some other examples herein, further comprises: forming a hydrogen bond breaking interlayer above the contact metal layer to break hydrogen bond to exploit electrostatics to reduce interstitial hydrogen entering the semiconductor device through the contact metal layer.

Example 17 may include the method of example 14 and/or some other examples herein, wherein the interstitial hydrogen behaves exclusively as a donor in the semiconducting oxide layer, and the rejected interstitial hydrogen is positively charged atomic hydrogen.

Example 18 may include the method of example 14 and/or some other examples herein, wherein the interstitial hydrogen behaves exclusively as an acceptor in the semiconducting oxide layer, and the rejected interstitial hydrogen is negatively charged atomic hydrogen.

Example 19 may include the method of example 14 and/or some other examples herein, wherein the semiconducting oxide material is an n-type material including ZnO, CdO, $In_2O_3$, $Ga_2O_3$, $SnO_2$, IGZO, IZO, ITO, GZO, or $TiO_2$, and the metal in the contact metal layer includes Sn, W, Ir, Pt, Ru, Rh, or Ni.

Example 20 may include the method of example 14 and/or some other examples herein, wherein the semiconducting oxide material is a p-type material including SnO, $Cu_2O$, CuO, $VO_2$, NiO, $ZnRh_2O_4$, $AlCuO_2$, $SrCu_2O_2$, or $La_2SeO_2$, and the metal in the contact metal layer includes Mn, Zn, or Cr.

Example 21 may include a computing device comprising: a circuit board; and an integrated circuit (IC) coupled to the circuit board, wherein the IC includes: a contact stack above a substrate and coupled to a semiconductor device, wherein the contact stack includes: a contact metal layer; and a semiconducting oxide layer adjacent to the contact metal layer, wherein the semiconducting oxide layer includes a semiconducting oxide material, the contact metal layer includes a metal with a sufficient Schottky-barrier height (SBH) to induce an interfacial electric field between the semiconducting oxide layer and the contact metal layer to reject interstitial hydrogen from entering the semiconductor device through the contact stack.

Example 22 may include the computing device of example 21 and/or some other examples herein, wherein the interstitial hydrogen behaves exclusively as a donor in the semiconducting oxide layer, and the rejected interstitial hydrogen is positively charged atomic hydrogen.

Example 23 may include the computing device of example 21 and/or some other examples herein, wherein the interstitial hydrogen behaves exclusively as an acceptor in the semiconducting oxide layer, and the rejected interstitial hydrogen is negatively charged atomic hydrogen.

Example 24 may include the computing device of example 21 and/or some other examples herein, wherein the contact stack further includes: a semiconducting interlayer between the contact metal layer and the semiconducting oxide layer, wherein the interstitial hydrogen behaves as both a donor and an acceptor to the semiconducting oxide layer, and behaves exclusively as a donor to the semiconducting interlayer, the metal in the contact metal layer has a sufficient SBH to induce an interfacial electric field between the semiconducting interlayer and the contact metal layer to reject interstitial hydrogen from entering the semiconductor device through the contact stack.

Example 25 may include the computing device of example 21 and/or some other examples herein, wherein the computing device is a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit, comprising:
   a substrate;
   a semiconductor device on the substrate; and
   a contact stack above the substrate and coupled to the semiconductor device, wherein the contact stack includes:
   a contact metal layer;
   a semiconducting oxide layer below the contact metal layer, wherein the semiconducting oxide layer includes a semiconducting oxide material; and
   a semiconducting interlayer between the contact metal layer and the semiconducting oxide layer, wherein the contact metal layer covers an entirety of an uppermost surface of the semiconducting interlayer.

2. The integrated circuit of claim 1, wherein the semiconducting oxide material is an n-type material or a p-type material.

3. The integrated circuit of claim 1, wherein the semiconducting oxide material is an n-type material selected from the group consisting of ZnO, CdO, $In_2O_3$, $Ga_2O_3$, $SnO_2$, IGZO, IZO, ITO, GZO, and $TiO_2$, and the metal in the contact metal layer includes a material selected from the group consisting of Sn, W, Ir, Pt, Ru, Rh, and Ni.

4. The integrated circuit of claim 1, wherein the semiconducting oxide material is a p-type material selected from the group consisting of SnO, Cu2O, CuO, $VO_2$, NiO, $ZnRh_2O_4$, $AlCuO_2$, $SrCu_2O_2$, and $La_2SeO_2$, and the metal in the contact metal layer includes Mn, Zn, or Cr.

5. The integrated circuit of claim 1, wherein the semiconducting interlayer includes a material selected from the group consisting of InAs, InSb, InP, InN, CdSe, SnO2, and TiO2 when the semiconducting oxide material is an n-type material, or the semiconducting interlayer includes a material selected from the group consisting of Ge, Si, GaSb, AlSb, InSb, and CdTe when the semiconducting oxide material is a p-type material.

6. The integrated circuit of claim 1, wherein the contact stack further includes:
a hydrogen bond breaking interlayer above the contact metal layer to break hydrogen bond to exploit electrostatics to reduce interstitial hydrogen entering the semiconductor device through the contact stack.

7. The integrated circuit of claim 6, wherein the hydrogen bond breaking interlayer includes a material selected from the group consisting of Pt, Ni, and Rh.

8. The integrated circuit of claim 1, wherein the semiconductor device is a transistor, and the contact stack is a source electrode of the transistor, or a drain electrode of the transistor.

9. The integrated circuit of claim 1, wherein the contact stack is a contact plug or a via of the integrated circuit.

10. The integrated circuit of claim 1, further comprising:
a contact plug adjacent to the contact stack.

11. The integrated circuit of claim 1, wherein the contact metal layer includes a metal with a sufficient Schottky-barrier height (SBH) to induce an interfacial electric field between the semiconducting oxide layer and the contact metal layer to reject interstitial hydrogen from entering the semiconductor device through the contact stack.

12. The integrated circuit of claim 11, wherein the interstitial hydrogen behaves as both a donor and an acceptor to the semiconducting oxide layer, and behaves exclusively as a donor to the semiconducting interlayer, the metal in the contact metal layer has a sufficient SBH to induce an interfacial electric field between the semiconducting interlayer and the contact metal layer to reject interstitial hydrogen from entering the semiconductor device through the contact stack.

13. The integrated circuit of claim 11, wherein the interstitial hydrogen behaves exclusively as a donor in the semiconducting oxide layer, and the rejected interstitial hydrogen is positively charged atomic hydrogen.

14. The integrated circuit of claim 11, wherein the interstitial hydrogen behaves exclusively as an acceptor in the semiconducting oxide layer, and the rejected interstitial hydrogen is negatively charged atomic hydrogen.

15. A computing device comprising:
a circuit board; and
an integrated circuit (IC) coupled to the circuit board, wherein the IC includes:
a contact stack above a substrate and coupled to a semiconductor device, wherein the contact stack includes:
a contact metal layer;
a semiconducting oxide layer below the contact metal layer, wherein the semiconducting oxide layer includes a semiconducting oxide material; and
a semiconducting interlayer between the contact metal layer and the semiconducting oxide layer, wherein the contact metal layer covers an entirety of an uppermost surface of the semiconducting interlayer.

16. The computing device of claim 15, wherein the computing device is a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the circuit board.

17. The computing device of claim 15, wherein the contact metal layer includes a metal with a sufficient Schottky-barrier height (SBH) to induce an interfacial electric field between the semiconducting oxide layer and the contact metal layer to reject interstitial hydrogen from entering the semiconductor device through the contact stack.

18. The computing device of claim 17, wherein the interstitial hydrogen behaves exclusively as a donor in the semiconducting oxide layer, and the rejected interstitial hydrogen is positively charged atomic hydrogen.

19. The computing device of claim 17, wherein the interstitial hydrogen behaves exclusively as an acceptor in the semiconducting oxide layer, and the rejected interstitial hydrogen is negatively charged atomic hydrogen.

20. The computing device of claim 17,
wherein the interstitial hydrogen behaves as both a donor and an acceptor to the semiconducting oxide layer, and behaves exclusively as a donor to the semiconducting interlayer, the metal in the contact metal layer has a sufficient SBH to induce an interfacial electric field between the semiconducting interlayer and the contact metal layer to reject interstitial hydrogen from entering the semiconductor device through the contact stack.

\* \* \* \* \*